(12) United States Patent
Nakajima et al.

(10) Patent No.: US 7,719,838 B2
(45) Date of Patent: May 18, 2010

(54) POWER INVERTER

(75) Inventors: Kenichiro Nakajima, Hitachinaka (JP); Haruki Hamada, Naka (JP); Koichi Yahata, Hitachinaka (JP); Hideki Homma, Hitachinaka (JP); Hideyo Suzuki, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/020,336

(22) Filed: Jan. 25, 2008

(65) Prior Publication Data

US 2008/0225487 A1  Sep. 18, 2008

(30) Foreign Application Priority Data

Mar. 15, 2007  (JP) ............... 2007-065976

(51) Int. Cl.
*H05K 7/20* (2006.01)

(52) U.S. Cl. ............. 361/699; 361/704; 361/707; 361/715; 165/80.4; 165/104.33

(58) Field of Classification Search ............... None
See application file for complete search history.

(56) References Cited

U.S. PATENT DOCUMENTS

| | | | |
|---|---|---|---|
| 5,623,399 A | 4/1997 | Ishii et al. | |
| 5,966,291 A * | 10/1999 | Baumel et al. | 361/707 |
| 6,166,937 A * | 12/2000 | Yamamura et al. | 363/141 |
| 6,434,003 B1 * | 8/2002 | Roy et al. | 361/699 |
| 6,442,023 B2 * | 8/2002 | Cettour-Rose et al. | 361/690 |
| 6,987,670 B2 * | 1/2006 | Ahmed et al. | 361/699 |
| 7,031,161 B2 * | 4/2006 | Miettinen et al. | 361/704 |
| 7,177,153 B2 * | 2/2007 | Radosevich et al. | 361/699 |
| 7,207,187 B2 | 4/2007 | Funahashi et al. | |
| 7,301,755 B2 * | 11/2007 | Rodriguez et al. | 361/676 |
| 2004/0227231 A1 | 11/2004 | Maly et al. | |
| 2005/0128706 A1 * | 6/2005 | Maly et al. | 361/699 |
| 2006/0290689 A1 | 12/2006 | Grant et al. | |
| 2007/0109715 A1 | 5/2007 | Azuma et al. | |
| 2007/0253164 A1 * | 11/2007 | Matsuo et al. | 361/699 |

FOREIGN PATENT DOCUMENTS

| | | |
|---|---|---|
| EP | 1 843 456 A2 | 10/2007 |
| JP | 2003-199363 A | 7/2003 |
| JP | 2003-324903 A | 11/2003 |
| JP | 2006-269933 A | 10/2006 |
| JP | 2007-143272 A | 6/2007 |

OTHER PUBLICATIONS

Corresponding Japanese Office Action dated Jan. 6, 2009 with English translation (Eight (8) pages).
European Search Report dated Feb. 10, 2010 (Three (3) pages).

* cited by examiner

*Primary Examiner*—Boris L Chervinsky
(74) *Attorney, Agent, or Firm*—Crowell & Moring LLP (57) ABSTRACT

The power inverter includes: a case made of a metal; a first power module provided in the case and including a DC terminal and an AC terminal; a second power module provided in the case and including a DC terminal and an AC terminal; and a cooling formation body for decreasing heat generated from the first and second power modules. The first and second power modules are disposed in a manner such that the DC terminals face each other.

10 Claims, 9 Drawing Sheets

POWER INVERTER

CLAIM OF PRIORITY

The present application claims priority from Japanese application serial No. 2007-65976, filed on Mar. 15, 2007, the contents of which are hereby incorporated by references into this application.

FIELD OF THE INVENTION

The present invention relates to a power inverter, for example, to a power inverter for use in a hybrid powered automobile or an electric motorcar.

BACKGROUND OF THE INVENTION

A power inverter comprises mainly an inverter main circuit, a smoothing capacitor connected in parallel with a DC power supply terminal of the inverter main circuit, and a control circuit for controlling the inverter main circuit. The inverter main circuit has plural power semiconductors, and a power module is formed by predetermined number of power semiconductors as a unit. Consequently, the inverter main circuit is configured as one or more power modules each having plural power semiconductors.

As an example of configuring such a power inverter as a unit, a unit is known in which plural power modules are arranged such that their input/output terminals are aligned in the vertical direction and a smoothing capacitor is disposed near the upper central section above the input terminal.

Such a power inverter is disclosed in, for example, Patent Document 1 (Japanese Unexamined Patent Application Publication No. 2003-199363).

In a field of an electric motorcar which is driven by only an electric motor without using an internal combustion engine and a hybrid powered automobile using both an internal combustion engine and an electric motor, it is desired to increase the proportion of the interior in the whole capacity of the vehicle as much as possible to improve comfortability.

Consequently, it is desired to miniaturize a control unit such that the control unit can be mounted in a space as small as possible. A power inverter electrically connected to a rotating electric machine for a vehicle is also desired to be miniaturized.

However, power of the rotating electric machine mounted on a vehicle is increasing and a heat generation amount of the power inverter is larger than that at the early stage of development. With increase in the power, the voltage used is also becoming higher. When the inductance of a main circuit is large, in many cases, surge voltage generated at the time of switching power semiconductors becomes an issue. As a solution, the withstand voltage of components may be increased. In this case, however, the whole apparatus becomes large.

SUMMARY OF THE INVENTION

In consideration of the above problems, an object of the present invention is to provide a power inverter realizing reduced inductance of a main circuit while suppressing upsizing.

A representative one of power inverters of the present invention is configured as follows.

A power inverter comprises a housing made of metal, a first power module which includes plural first semiconductor chips, a first DC (Direct Current) terminal and a first AC (Alternate Current) terminal, and that is housed in the metal case, a first power module which includes plural second semiconductor chips, a second DC (Direct Current) terminal and a second AC (Alternate Current) terminal, and that is housed in the housing, and a cooling section for cooling heat generated from the first and second power modules. The first and second power modules are arranged in a manner such that the first and second DC terminals face each other.

The other features of the representative configuration of the present invention will be described in detail in each of the following embodiments.

According to the present invention, a power inverter realizing reduced inductance of a main circuit can be provided. In addition, a smaller power inverter can be provided.

DETAILED DESCRIPTION OF PREFERRED EMBODIMENTS OF THE INVENTION

Embodiments of a power inverter will be described hereinbelow in detail with reference to the drawings.

(Hybrid Powered Automobile 100)

Figure 1:
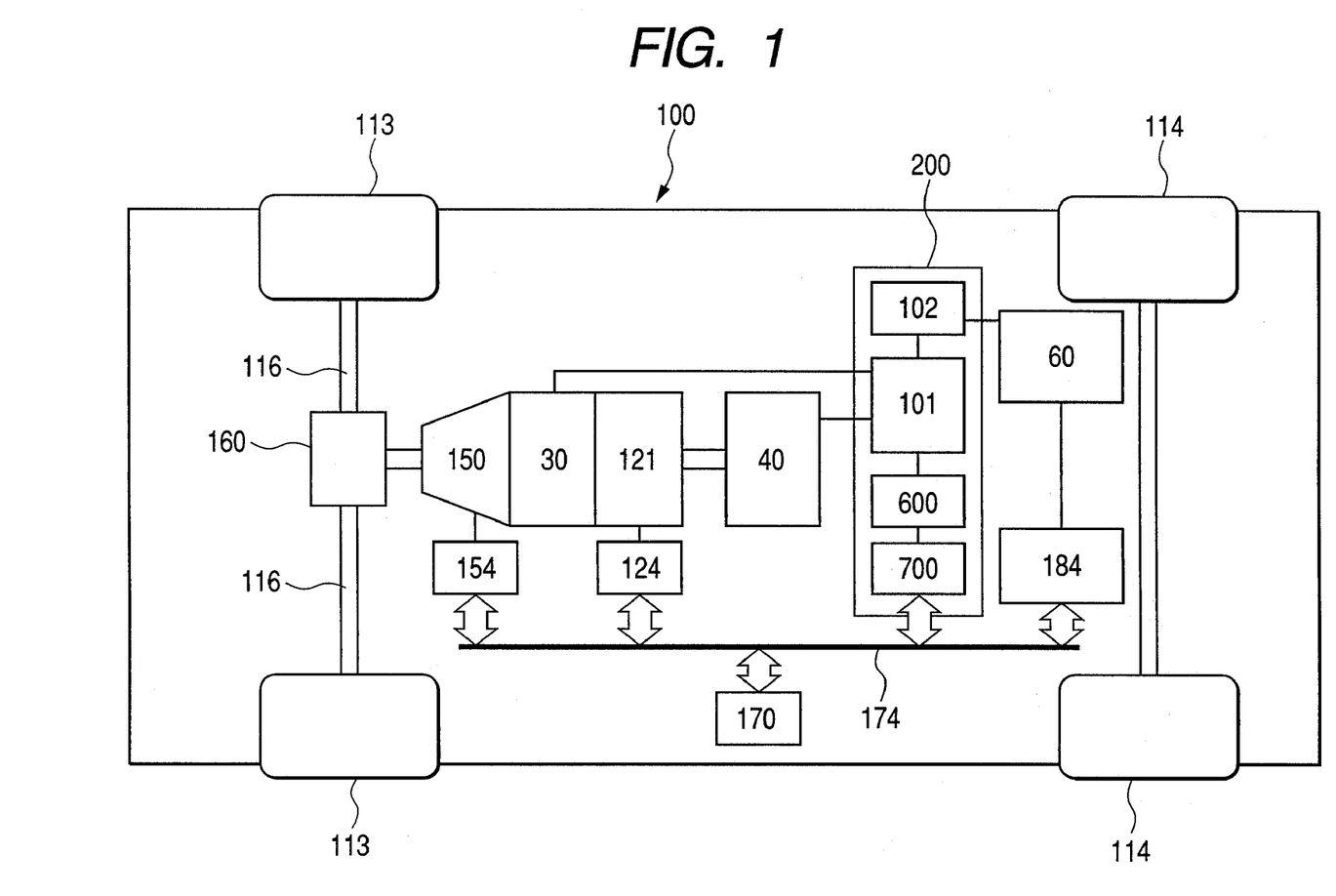
FIG. 1 is a system diagram showing an example of a hybrid powered automobile with a power inverter.

FIG. 1 is a configuration diagram showing a hybrid powered automobile 100 provided with a power inverter.

A power inverter 200 can be obviously applied to an electric motorcar. In this case, a hybrid powered automobile and an electric motor car have many common basic configurations and many basic operations between both. Consequently, in the following, an embodiment of the hybrid powered automobile 100 as a representative of them will be described.

The hybrid powered automobile 100 has front wheels 113 rear wheels 114, an engine 121, a first rotating electric machine 30, a second rotating electric machine 40, and a battery 60 for supplying high-voltage DC power to the first and second rotating electric machines 30 and 40 are mounted. In practice, a battery for supplying low-voltage power (14-volt power) is also mounted. Although the battery supplies power as a power source of control circuits described below, it is not shown in the diagram.

Torque based on the engine 121 and the first and second rotating electric machines 30 and 40 is transferred to a transmission 150 and a differential gear 160. The torque is transferred to the front wheels 113 or the rear wheels 114 via an axle 116.

A transmission control unit 154 for controlling the transmission 150, an engine control unit 124 for controlling the engine 121, a rotating electric control circuit board 700 for controlling the power inverter 200, and a battery control unit 184 for controlling the battery 60 are connected to a vehicle control unit 170 via communication lines 174 such as a local area network.

The vehicle control unit 170 receives information indicative of states from the transmission control unit 154, the engine control unit 124, the power inverter 200, and the battery control unit 184 as lower-order control units via the communication lines 174. The information is used to perform integration control on the vehicle from the viewpoint of safety and the like.

The vehicle integration control is a control achieved by associated operations of the control units. Control instructions to the control units for realizing the integration control of the vehicle are transmitted from the vehicle control unit 170 to each of the control units via the communication lines 174.

For example, the battery control unit 184 informs the vehicle control unit 170 of a discharge state of the battery 60 and the states of cells constructing the battery. When it is determined from the information that the battery 60 has to be charged, the vehicle control unit 170 instructs the power inverter 200 to generate power. The vehicle control unit 170 manages output torques of the engine 121 and the first and second rotating electric machines 30 and 40, and obtains total torque of output torques of the engine 121 and the first and second rotating electric machines 30 and 40, or a torque distribution ratio by arithmetic process.

The control instructions based on the process result are transmitted to the transmission control unit 154, the engine control unit 124, and the power inverter 200. On the basis of a torque instruction, the power inverter 200 controls the first and second rotating electric machines 30 and 40 to generate an instructed torque output from the first rotating electric machine 30 and/or the second rotating electric machine 40.

Each of the first and second rotating electric machines 30 and 40 has a structure capable of operating as a motor or a generator. For example, in the case where the first rotating electric machine 30 operates as a motor, the second rotating electric machine 40 can operate as a motor or a generator.

As described above, on the basis of the vehicle driving state, the vehicle control unit 170 determines each of a target output torque of the engine 121 and a target output torque of the rotating electric machine by arithmetic operation. The target torque of the rotating electric machine is transmitted as a torque instruction to the power inverter 200 via the communication line 174.

The power inverter 200 determines, by arithmetic process, whether each of the first and second rotating electric machines 30 and 40 is operated as a motor or generator on the basis of the instruction, and controls the first and second rotating electric machines 30 and 40.

As another embodiment, whether each of the first and second rotating electric machines 30 and 40 is operated as a motor or generator can be also determined by arithmetic operation by the vehicle control unit 170. According to the method, when the first or second rotating electric machine 30 or 40 is operated as a motor, the vehicle control unit 170 determines the torque generated by the motor. When the first or second rotating electric machine 30 or 40 is operated as a generator, the vehicle control unit 170 determines the generated power. The determined torque is transmitted as an instruction to the power inverter 200 via the communication line 174.

In any of the methods, on the basis of the instruction from the vehicle control unit 170, the power inverter 200 controls switching operation of power semiconductors as components of the inverter main circuit for operating the first and second rotating electric machines 30 and 40. By the switching operations of the power semiconductors, each of the first and second rotating electric machines 30 and 40 is operated as a motor or a generator.

In the case where the first rotating electric machine 30 or the second rotating electric machine 40 is operated as a motor, the DC power from the high-voltage battery 60 is applied to the inverter main circuit of the power inverter 200. The switching operation of the power semiconductors constructing the inverter main circuit is controlled, thereby converting DC power to alternating current of three phases. The alternating current is supplied to the first rotating electric machine 30 or the second rotating electric machine 40. As a result, the first rotating electric machine 30 or the second rotating electric machine 40 as a motor generates a torque.

On the other hand, in the case where the first rotating electric machine 30 or the second rotating electric machine 40 is operated as a generator, the rotor of the first rotating electric machine 30 or the second rotating electric machine 40 is rotated by the torque from the outside. On the basis of the torque, the AC power of three phases is generated in the stator winding of the rotating electric machine. The generated 3-phase AC power is converted to DC power by the power inverter 200. The DC power is supplied to the high-voltage battery 60 and the battery 60 is charged.

The engine 121 and the first and second rotating electric machines 30 and 40 shown in FIG. 1 may be mechanically directly coupled to each other by a rotary shaft or via a gear or clutch. In the case where the engine 121, the first rotating electric machine 30, and the second rotating electric machine 40 are directly coupled to each other, the first and second rotating electric machines 30 and 40 rotate in proportional to the rotation speed of the engine 121. Consequently, the rotational speed of the first and second rotating electric machines 30 and 40 changes in a wide range from a rotation stop state to a high-speed rotation state. Therefore, the first and second rotating electric machines 30 and 40 need mechanical intensity so as to withstand high-speed rotation.

When the first and second rotating electric machines 30 and 40 rotate, an iron loss always occurs in the rotating electric machines. In particular, in the high-speed rotation state, there is a problem such that the iron loss is large. On the other hand, the method has advantages such that the structure is simple and cheap.

The method in which the first and second rotating electric machines 30 and 40 are connected to the driving mechanism of the vehicle via a clutch and a change gear has an advantage such that the fluctuation range of the rotation speed of the first and second rotating electric machines 30 and 40 can be made small. As necessary, the first and second rotating electric machines 30 and 40 can be separated from the driving mechanism of the vehicle, and there is an effect such that the driving efficiency can be prevented from being deteriorated due to an iron loss or the like of the rotating electric machines.

As shown in FIG. 1, the power inverter 200 includes a capacitor module 102 having plural smoothing capacitors for suppressing voltage fluctuations of a DC power supply, a power module 101 having therein plural power semiconductors, a board having a switching drive circuit for controlling switching operation of the power module 101 (hereinbelow, called a drive circuit board 600), and a board having a rotating electric control circuit for generating a signal determining time width of the switching operation, that is, a PWM signal for controlling pulse wide modulation (hereinbelow, called a control circuit board 700).

By electrically connecting the power module 101 to periphery circuits and power source, the power semiconductors of the power module 101 are electrically connected, thereby constructing the inverter main circuit. A signal for controlling the power semiconductors constructing the inverter main circuit is generated by the control circuit board 700 and is transmitted to the drive circuit board 600.

The drive circuit board 600 is a gate drive circuit of a so-called power semiconductor, and generates a gate drive signal supplied to a gate terminal of each of the power semiconductors. The gate drive signal is transmitted to the gate terminal of each of the power semiconductors. On the basis of the gate drive signal, each of the power semiconductors performs the switching operation.

The detailed circuits and operations of the capacitor module 102 and the power module 101 will be described later.

The high-voltage battery 60 is a secondary battery such as a nickel hydrogen battery or a lithium ion battery. The batteries output high-voltage DC power of 300 volts or 600 volts or higher.

(Circuit Configuration of Power Inverter)

Figure 2:
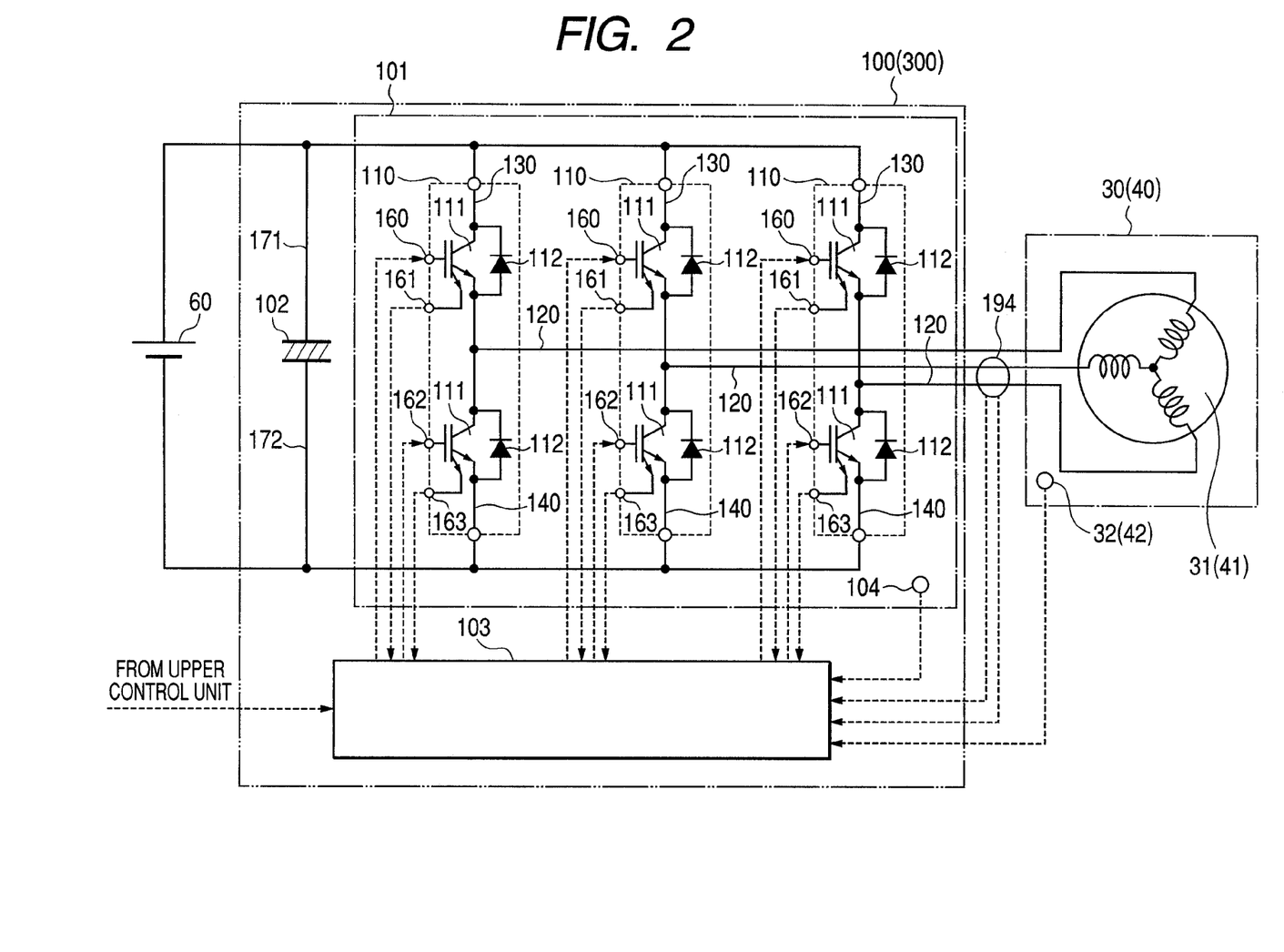
FIG. 2 is a circuit configuration diagram of the power inverter.

Referring now to FIG. 2, the circuit configuration of the power inverter 200 will be described. In the embodiment, a power system is shown by solid lines and a signal system is shown by dotted lines such that the power and signal systems can be distinguished from each other.

The power inverter 200 has the power module 101, the capacitor module 102, and a control unit 103. The control unit 103 is configured by the control circuit board 700 and the drive circuit board 600.

The power module 101 is a component of a main circuit for power conversion and comprises plural power semiconductor elements for switching. The plural power semiconductor elements used for switching receive a drive signal output from the drive circuit board 600 as a part of the control unit 103, operate, and convert the DC power supplied from the battery 60 to 3-phase AC power.

The converted power is supplied to an armature winding 31 of the first rotating electric machine 30 or an armature winding 41 of the second rotating electric machine 40. The main circuit for power conversion is configured by a 3-phase bridge circuit. Series circuits of three phases are electrically connected in parallel between a positive electrode and a negative electrode of the battery 60. Each of series circuits is called as an arm and is comprised of switching power semiconductor elements on the upper arm side and on the lower arm side.

In the embodiment, an IGBT (Insulated Gate Bipolar Transistor) 111 is used as the power semiconductor element for switching. The IGBT 111 has three electrodes: namely collector electrode, an emitter electrode, and a gate electrode. A diode 112 is electrically connected between the collector electrode and the emitter electrode of the IGBT 111. The diode 112 has two electrodes: a cathode electrode and an anode electrode. The cathode electrode is electrically connected to the collector electrode of the IGBT 111 and the anode electrode is electrically connected to the emitter electrode of the IGBT 111 such that the direction from the emitter electrode of the IGBT 111 to the collector electrode becomes the forward direction.

As the power semiconductor element for switching, in place of the IGBT 111, a MOSFET (Metal Oxide Semiconductor Field Effect Transistor) may be used. The MOSFET has three electrodes: a drain electrode, a source electrode, and a gate electrode.

In the MOSFET, a parasitic diode in which the direction from the drain electrode to the source electrode becomes the forward direction is provided between the source electrode and the drain electrode. It is therefore unnecessary to provide an external diode 112 like an IGBT.

Arms corresponding to three phases (total six arms) are provided in correspondence with the armature windings 31 and 41 of the first and second rotating electric machines 30 and 40. Each of the three phases is configured by electrically connecting the emitter electrode of the IGBT 111 on the upper arm side and the collector electrode of the IGBT 111 on the lower arm side in series via an intermediate electrode 120. The collector electrode of the IGBT 111 on the upper arm side of each phase is electrically connected to a positive-side capacitor electrode 171 of the capacitor module 102 via a positive-side electrode 130. The emitter electrode of the IGBT 111 of the lower arm side of each phase is electrically connected to a negative-side capacitor electrode 172 of the capacitor module 102 via a negative-side electrode 140.

The intermediate electrode 120 in an intermediate-point part (a connection part between the emitter electrode of the IGBT 111 on the upper arm side and the collector electrode of the IGBT 111 on the lower arm side) of each arm is electrically connected to phase windings corresponding to the armature windings 31 and 41 of the first and second rotating electric machines 30 and 40. Although one phase (two arms) is constructed by a single electric circuit device 110 in the embodiment, the invention is not limited to the embodiment.

The capacitor module 102 is used to smooth fluctuations in the DC voltage caused by switching operation of the IGBT 111. The positive-side capacitor electrode 171 of the capacitor module 102 is electrically connected to the positive electrode of the battery 60. The negative-side capacitor electrode 172 of the capacitor module 102 is electrically connected to the negative electrode of the battery 60. As a result, the capacitor module 102 is connected electrically in parallel with the each of the DC side of the power module 101 (between the positive-side electrode 130 and the negative-side electrode 140 of three phases) and the battery 60 between the DC side (input side) of the power module 101 and the battery 60.

The control unit 103 is provided for operating the IGBT 111 and comprises the control circuit board 700 for generating a timing signal for controlling the switching timing of the IGBT 111 on the basis of input information from the other control units and sensors, and the drive circuit board 600 for generating a drive signal for making the IGBT 111 perform switching operation on the basis of the timing signal output from the control circuit board 700.

The control circuit board 700 is configured by a microcomputer. The microcomputer takes in the following information: a target torque value requested for the first rotating electric machine 30 or the second rotating electric machine 40, a current value supplied from the power module 101 to the armature winding 31 of the first rotating electric machine 30 or the armature winding 41 of the second rotating electric machine 40, and the magnetic pole position of the rotor of the first rotating electric machine 30 or the second rotating electric machine 40.

The target torque value is based on the instruction signal output from a high-order control unit. The current value is sensed on the basis of a sensing signal output from a current sensor 194. The magnetic pole position is sensed on the basis of a sensing signal output from a rotating magnetic pole sensor 32 provided for the first rotating electric machine 30 or a rotating magnetic pole sensor 42 provided for the second rotating electric machine 40. Although the case of sensing current values of two phases will be described as an example in the embodiment, current values of three phases may be detected.

The microcomputer computes current instruction values of d and q axes on the basis of the target torque value. The microcomputer computes voltage instruction values of the d and q axes on the basis of the difference between the sensed current values of the d and q axes, and converts the computed voltage instruction values of the d and q axes to voltage instruction values of the U phase, the V phase, and the W phase, on the basis of the sensed magnetic pole position. The microcomputer generates a pulse-shaped modulation wave on the basis of comparison between a fundamental wave (sine wave) on the voltage instruction values of the U phase, the V phase, and the W phase and a carrier wave (triangle wave), and outputs the generated modulation wave as a PWM (Pulse Width Modulation) signal to the drive circuit. To the drive circuit, six PWM signals are output from the microcomputer in correspondence with the upper and lower arms of the phases. Other signals such a rectangular wave signal may be used as timing signals output from the microcomputer.

The drive circuit board 600 is configured by an integrated circuit (IC) on which plural electronic circuit parts are integrated. In the embodiment, the case (1in1) of providing a single IC for each of the upper and lower arms of each phase will be described as an example. It is also possible to provide a single IC for each of the phase (2in1) or a single IC for all of the arms (6in1).

When driving the lower arm, the drive circuit board 600 amplifies the PWM signal and outputs the amplified signal as a drive signal to the gate electrode of the IGBT 111 of the corresponding lower arm. When driving the upper arm, the drive circuit board 600 shifts the level of the reference potential of the PWM signal to the level of the reference potential of the upper arm, amplifies the PWM signal, and outputs the amplified signal as a drive signal to the gate electrode of the IGBT 111 of the corresponding upper arm. Accordingly, each of the IGBTs 111 performs the switching operation on the basis of the input drive signal.

In the control circuit board 700, abnormal detection (over-current, over-voltage, over-temperature, and the like) is performed to protect the power module 101. Consequently, sensing information is input to the control circuit board 700. For example, from a sensor lead wire 163 of each of the arms, information of current flowing in the emitter electrode of each of the IGBTs 111 is input to the control circuit board 700. Thereby, the control circuit board 700 performs over-current detection. When over-current is detected, the switching operation of the corresponding IGBT 111 is stopped, and the corresponding IGBT 111 is protected from the over-current. From the temperature sensor 104 provided for the power module 101, the temperature information of the power module 101 is input to the microcomputer. The voltage information on the DC positive electrode side of the power module 101 is also input to the microcomputer. Based on those pieces of information, the microcomputer performs the over-temperature detection and the over-voltage detection. When over-temperature or over-voltage is detected, the switching operation of all of the IGBTs 111 is stopped to protect the power module 101 from the over-temperature or over-voltage.

(Appearance of Power Module)

Figure 9:
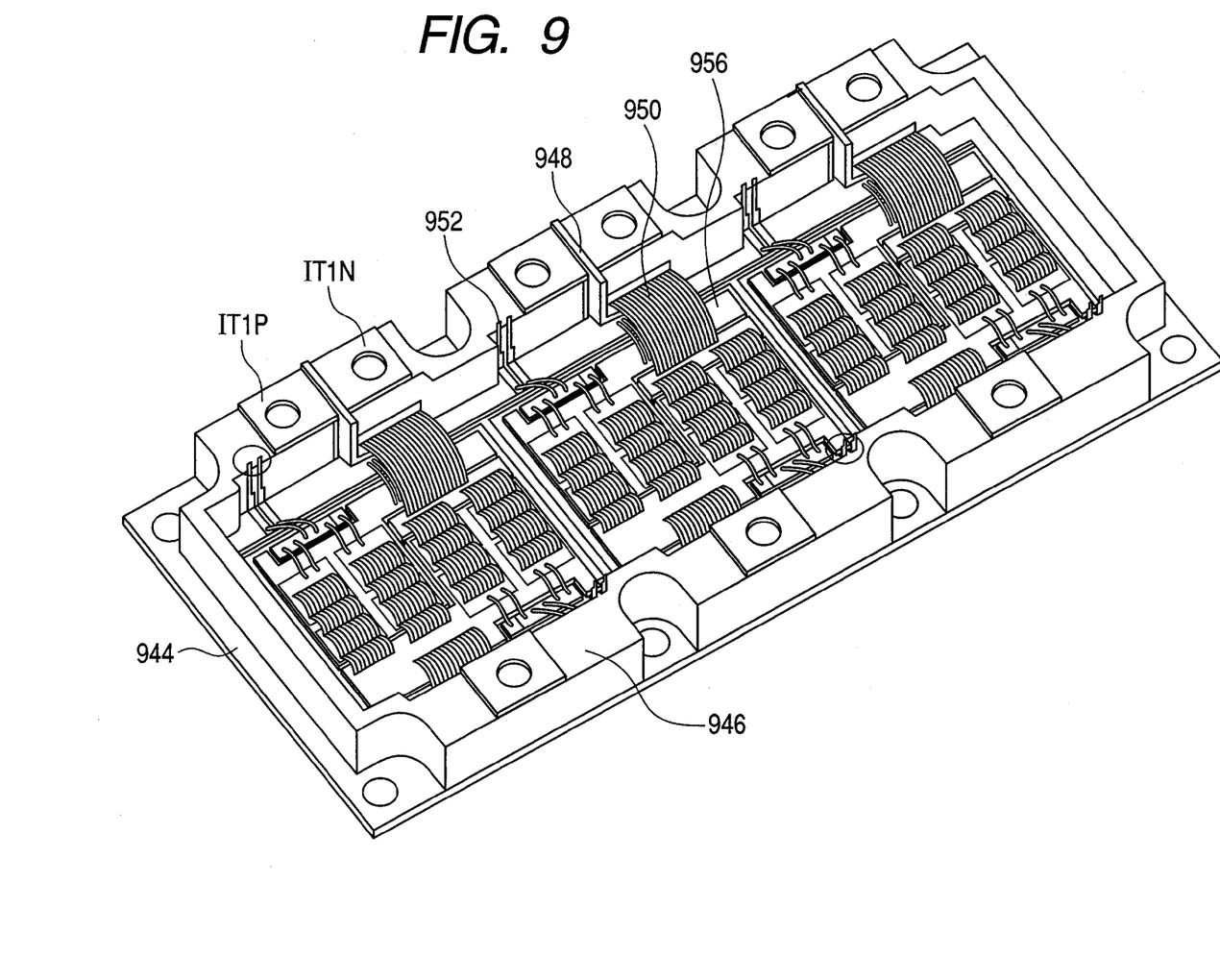
FIG. 9 is an external perspective view of the power module provided for the power inverter.

FIG. 9 is a representative structure diagram of the power module 101 used for the power inverter 200 of the embodiment. Connection between the semiconductor chip (the IGBTs 111 and the diodes 112) and terminals of the semiconductor chip is included in the diagram.

In the power module 101, a resin case 946 is mounted on one side of a metal base 944 made of copper or the like. In the resin case 946, the plural IGBTs 111 and diodes 112 are mounted on the metal base 944.

Sets of the plural IGBTs 111 and diodes 112 are divided to the U phase, the V phase, and the W phase in order to perform the PWM control. In the diagram, two sets of the IGBTs 111 and the diodes 112 connected in parallel are mounted on each of the arms for passing heavy current of a large amount which cannot be passed only by a single semiconductor chip. For each of the phases, the IGBTs 111 and the diodes 112 of two sets of the upper arm connected to the positive electrode terminal side as a DC terminal and the lower arm connected to the negative electrode terminal side as a DC terminal are mounted. Consequently, total 12 sets of the IGBTs 111 and the diodes 112 exist in the power module 101 of the diagram.

Each of a positive electrode terminal IT1P and a negative electrode terminal IT1N as DC terminals has a stack structure via an insulating sheet 948 in the resin case. With such a stack structure, the inductance in the DC wiring part can be reduced.

The DC terminals are electrically connected to the IGBT 111 or diode 112 via a bonding wire 950. The DC terminals may be connected by using a metal plate in place of the bonding wire 950. By using the metal plate, as compared with the case using the bonding wire 950, heavy current can be passed while maintaining reliability. In addition, the inductance in the wiring part can be reduced.

The power module is provided with each gate pin 952 to input a control signal from the gate board. The gate pin 952 is connected to the gate terminal of each of the IGBTs 111.

The IGBTs 111 and the diodes 112 are mounted on an insulating substrate 956 made of aluminum nitride (AlN) or the like. The aluminum nitride (AlN) is favorably used because of its excellent thermal conduction. In place of aluminum nitride (AlN), silicon nitride (SiN) can also be used. Since silicon nitride (SiN) has high performance, the insulating substrate 956 can be formed thinly.

On the metal base 944 side of the insulating substrate 956, patterns are formed on the entire surface by using Ni-plated copper or the like. A wiring pattern is formed of an Ni-plated copper or the like on the chip (IGBTs 111 and diodes 112) side. By providing such metals on both sides of the insulating substrate 956, soldering between the chip and the metal base 944 is enabled, and a sandwich structure in which the insulating substrate 956 is sandwiched by metals is obtained.

With such a configuration, deformation due to variations in the coefficient of thermal expansion at the time of temperature change is prevented. As a result of employment of the sandwich structure, when the insulating substrate 956 is thinned, according to a change in current flowing in the wiring pattern on the chip 952 side at the time of switching, eddy current induced by the entire-face pattern on the metal base 944 side increases. As a result, parasitic inductance in the wiring pattern on the insulating substrate 956 can be reduced, and it contributes to reduction in the inductance of the power module 101.

Silicone resin is applied (not shown) on the inside of the resin case 946. The IGBTs 111, the diodes 112, and the bonding wires 950 are covered with the silicone resin. In place of the silicone resin, another resin can be used. By covering the silicone resin with a resin cover (not shown), the power module 101 is completed. On the resin cover, the gate substrate 201 which will be described later is mounted.

(Appearance of Power Inverter)

Figure 3:
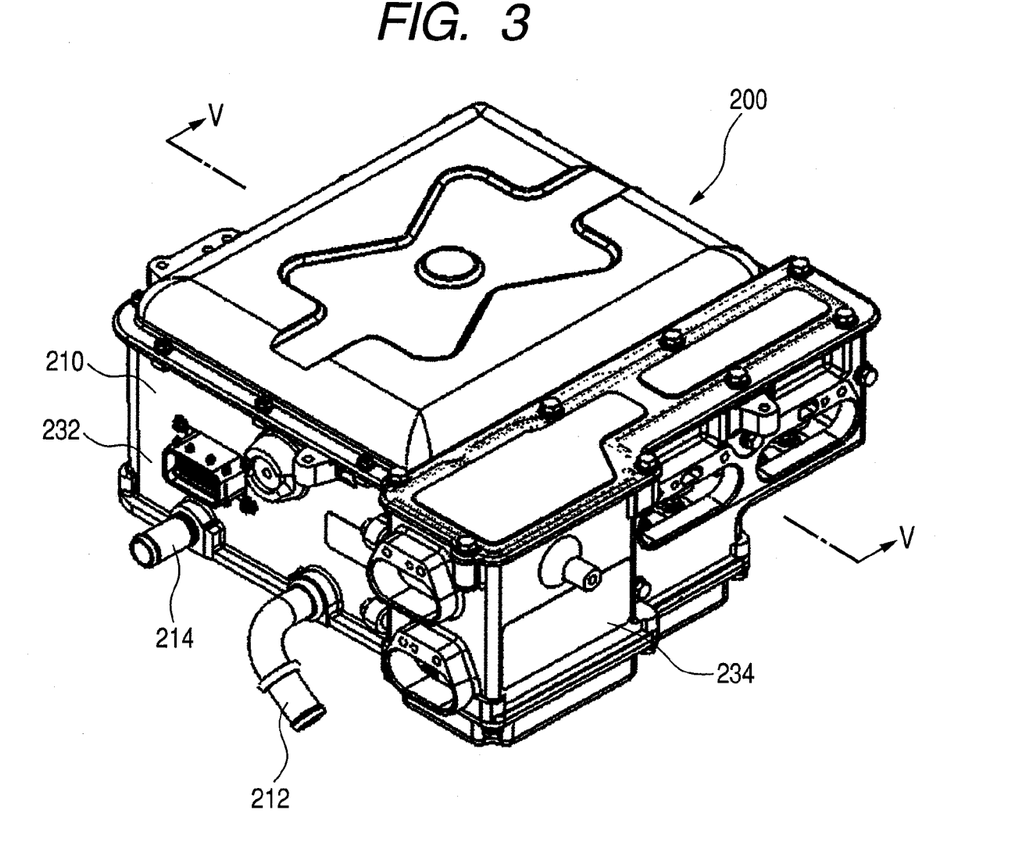
FIG. 3 is an external perspective view showing an embodiment of the power inverter.

FIG. 3 is an external perspective view of the power inverter 200 in the embodiment. The power inverter 200 is constructed in a compact shape as shown in FIG. 3.

The power inverter 200 has a housing 210 made of a metal material such as aluminum. The metal housing 210 is formed in an approximately square-shaped box, at its bottom, a water channel structure as a cooling section having a coolant channel. The top of the housing 210 can be opened.

In consideration of the following description, one of the four side walls of the housing 210 will be called as a front wall 232, and a right side wall as one of the side walls adjacent to the front wall 232 will be called as a main side wall 234.

The parts such as the power module 101, and the capacitor module 102, and the like are housed in the housing 210.

Figure 4:
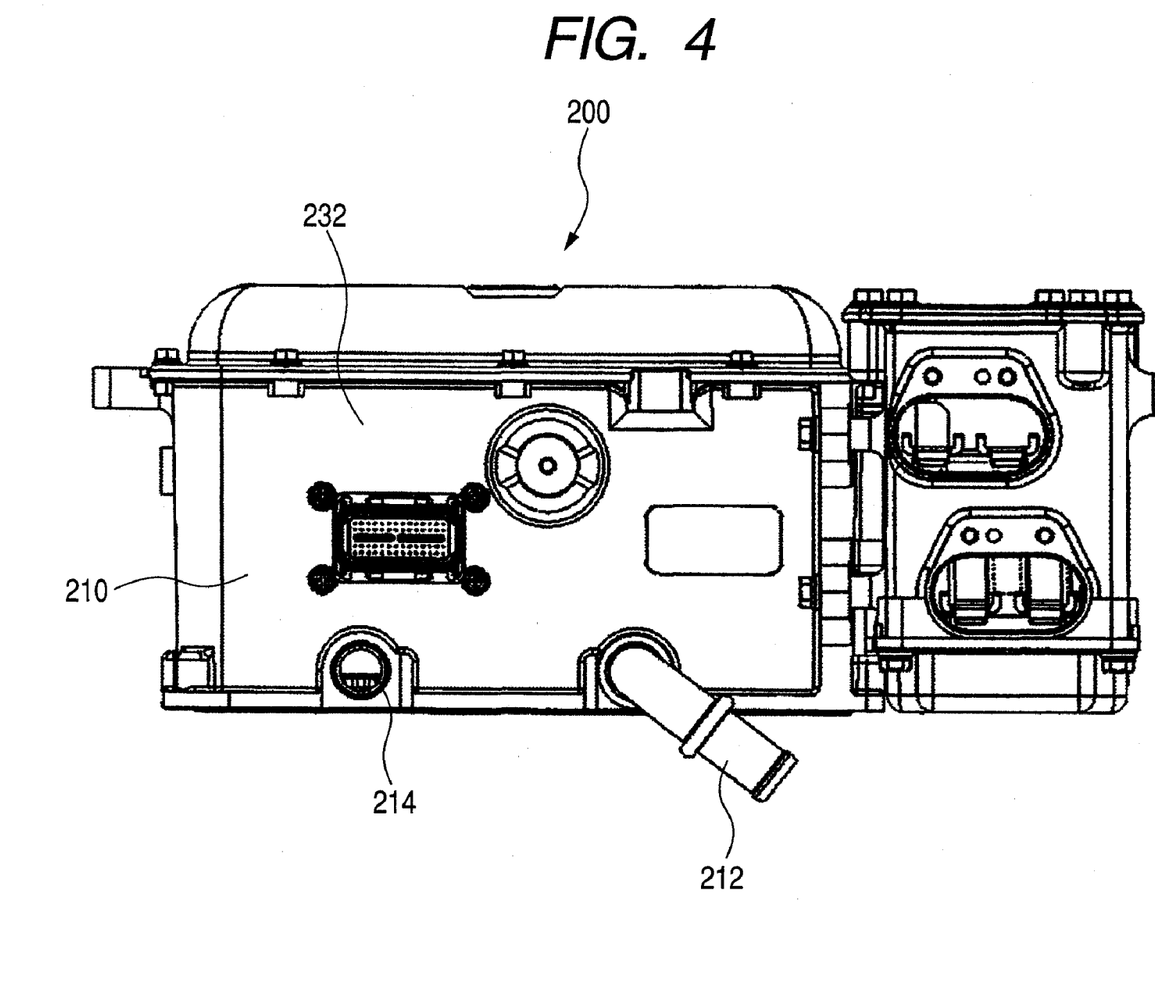
FIG. 4 is a diagram viewed from the front wall face side of the embodiment of the power inverter.

FIG. 4 is a diagram of the power inverter 200 viewed from the front wall 232 side of the housing 210. On the side face of the housing 210, an inlet pipe 212 for make coolant flow into a water channel structure (cooling section) 220 which will be described later, and an outlet pipe 214 for make coolant flow out from the water channel structure.

Figure 5:
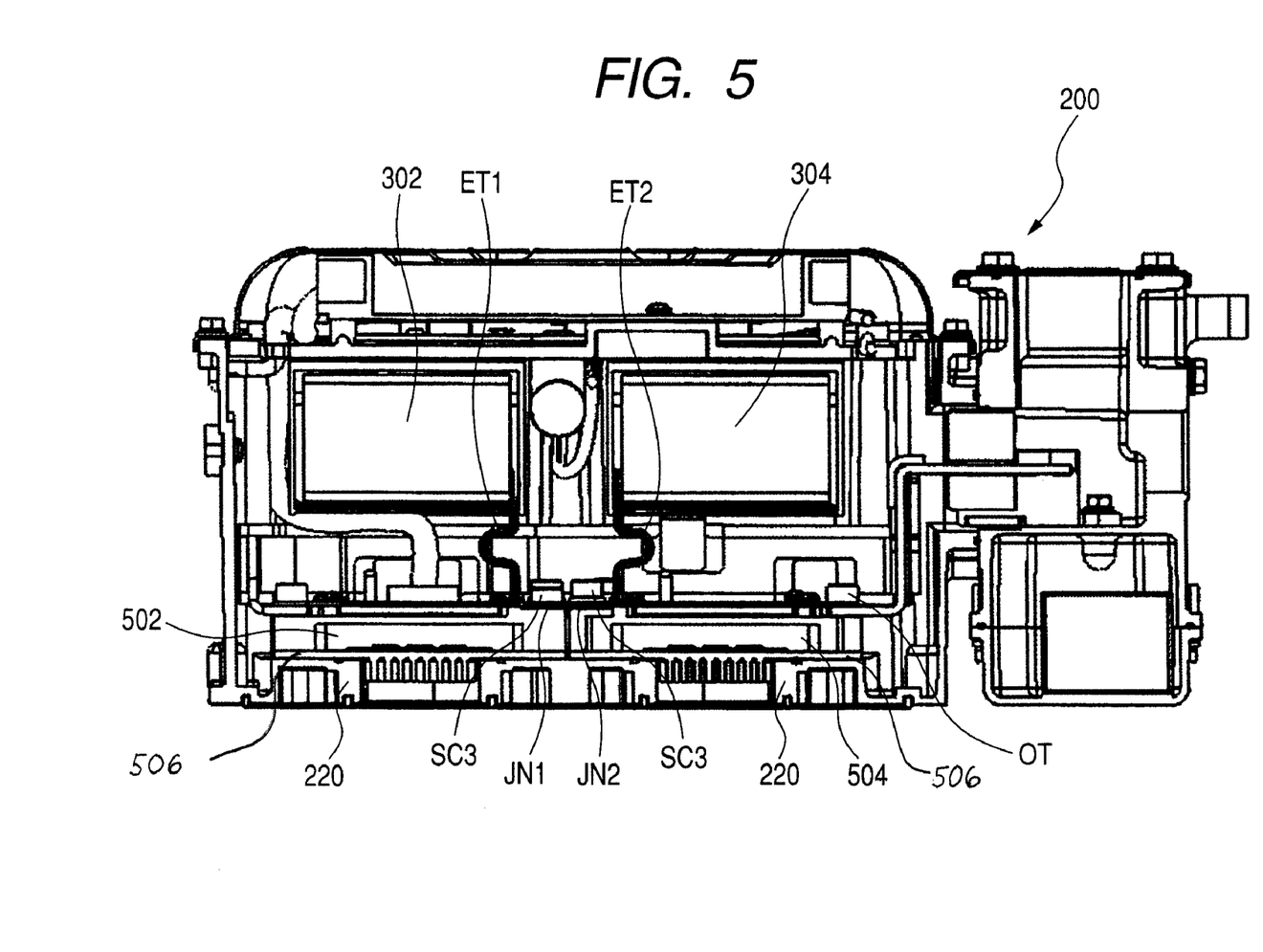
FIG. 5 is a cross section taken along line V-V of FIG. 3.

FIG. 5 is a cross section taken along line V-V of FIG. 3.

In the embodiment, the power inverter 200 has two power modules. A first power module 502 and a second power module 504 are arranged in a lower part in the housing 210. The first power module 502 drives the first rotating electric machine 30 (electric motor or generator) and the second power module 504 drives the second rotating electric machine 40 (generator or electric motor).

The water channel structure 220 through which coolant flows is provided in the lower part of the power inverter 200. The coolant flows in the water channel structure from the inlet port 212 and flows out from the outlet port 214 to decrease heat generated by the first and second power modules 502 and 504 which have the plural power semiconductor elements.

The top of the water channel structure 220 has a mouth (opening) which is closed with metal bases 506 of the first and second power modules 502 and 504. By fixing the metal bases 506 using screw etc. so as to close the top of the water channel structure 220, it is possible to flow the coolant through the water channel.

Each of the metal bases 506 acts as a heatsink in cooperation with the water channel, and it is provided with a fin to improve cooling efficiency. As the configuration of the fin, a straight fin in which plural plate-shaped projections are arranged in parallel and a pin type fin in which a number of pin-shaped projections are arranged is used.

The first and second capacitor modules 302 and 304 are arranged above the first and second power modules 502 and 504, respectively. The first power module 502 and the first capacitor module 302 are electrically connected together via an electrode ET1. The second power module 504 and the second capacitor module 304 are electrically connected together via an electrode ET2. Furthermore, a pair of the first power module 502 and the first capacitor module 302 and a pair of second power module 504 and the second capacitor module 304 are electrically connected to each other via the electrodes ET1, ET2 and the junctions JN1, JN2.

Consequently, the first and second capacitor modules 302 and 304 are electrically connected to each other. As a result, the first and second capacitor modules 302 and 304 are shared by both the first and second power modules 502 and 504. Incidentally it is also possible to arrange a single capacitor module in place of the two capacitor module and share the single capacitor module by the first and second power modules 502 and 504.

The first and second capacitor modules 302 and 304 are arranged such that the electrodes ET1 and ET2 are positioned near to the center of the housing 210.

Each of the electrodes ET1 and ET2 has a partial curvature portion (oxbow) for supporting the first and second capacitor modules 302 and 304, respectively. By providing such curvature portions, the heavy capacitor modules can be stably supported.

Figure 6:
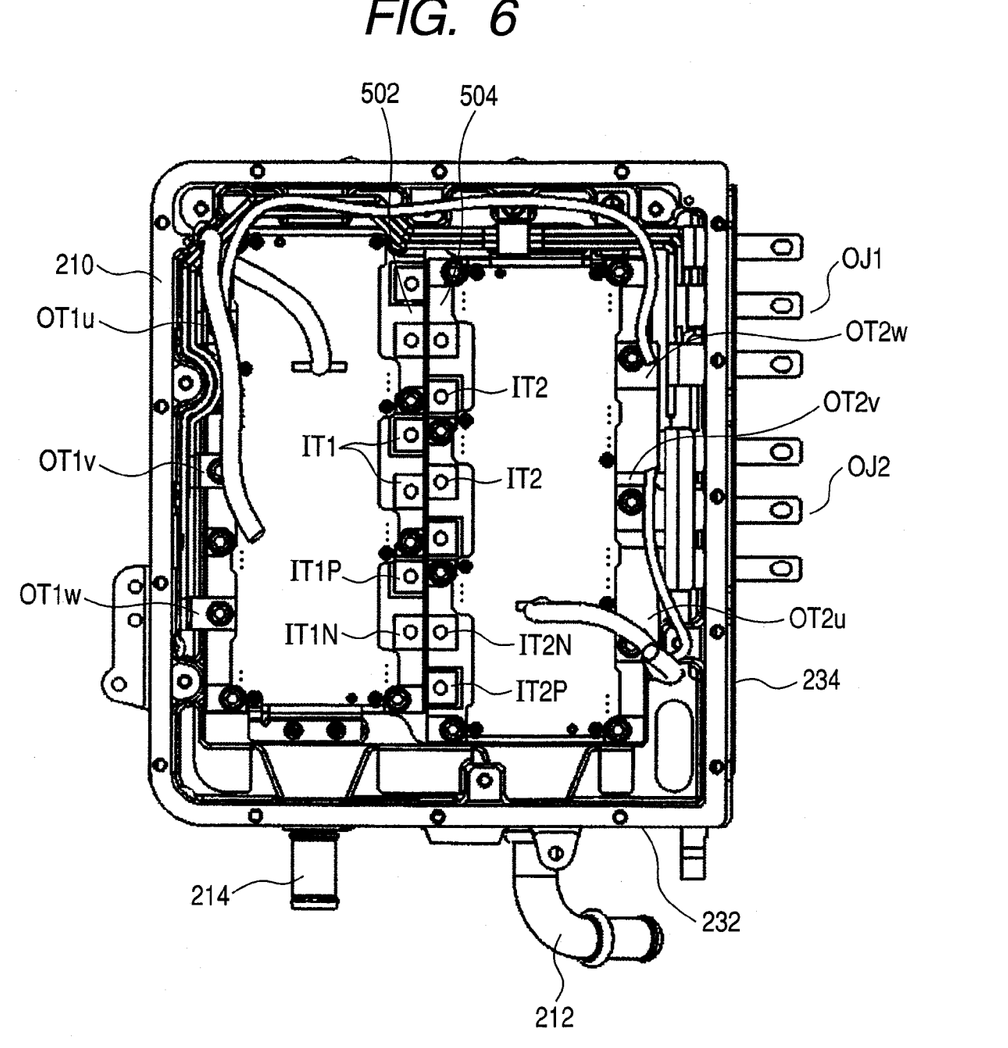
FIG. 6 is a plan view showing arrangement of a power module in a case in the power inverter.

FIG. 6 shows a plan view where the first and second power modules 502 and 504 are arranged in the housing 210.

The first and second power modules 502 and 504 are arranged in parallel such that sides in the shorter direction (namely short sides) become parallel with the front wall 232 of the housing 210 and sides in the longer direction (namely long sides) become parallel with the main side wall 234. The first and second power modules 502 and 504 are arranged in an approximately same plane.

In the embodiment, each of the first and second power modules 502 and 504 have 3 pairs of the DC terminals IT1 or IT2, respectively. The DC terminal IT1 per one pair comprises a positive electrode terminal IT1P connected to the positive electrode terminal of the battery 60 and a negative electrode terminal IT1N connected to the negative electrode terminal of the battery 60. Also, the DC terminal IT2 per one pair comprises a positive electrode terminal IT2P connected to the positive electrode terminal of the battery 60 and a negative electrode terminal IT2N connected to the negative electrode terminal of the battery 60. The positive and negative electrode terminals IT1P and IT1N are alternately arranged along one long side of the first power module 502, and the positive and negative electrode terminals IT2P and IT2N also are alternately arranged along one long side of the second power module 502.

The first and second power modules (502, 504) have the AC terminals (OT1, OT2) arranged another along side thereof, respectively. The AC terminals (OT1, OT2) comprise 3-phase AC terminals (OT1u, OT1v, OT1w; OT2u, OT2v, OT2).

Although the first and second power modules (502, 504) have the same configuration and arrangement of the DC terminals (IT1, IT2) and AC terminals (OT1, OT2), the second power module 504 is turned by 180° with respect to the first power module 502. Therefore, the first and second power modules (502, 504) are set such that the DC terminals (IT1, IT2) face each other.

In this case, more preferably, the first and second power modules 502 and 504 are set slightly so as to shift from each other in a longitudinal direction such a manner in that the corresponding DC terminals IT1 and IT2 are close to each other.

As shown in FIG. 6, since the first and second power modules (502, 504) are set such that their DC terminals (IT1, IT2) face each other, the DC terminals (IT1, IT2) are positioned in the neighborhood of a center line of the housing 210. The AC terminals OT1 (OT1u, OT1v, OT1w) and OT2 (OT2u, OT2v, OT2w) are disposed close to sides of the housing 210. With such a layout, the AC terminals OT1 and OT2 are easily output to the outside.

Positive electrode terminals (IT1P, IT2P) and negative electrode terminals (IT1N, IT2N) constructing the DC terminals (IT1, IT2) are arranged in consideration of electric connection by the junction JN1 and JN2. That is, in the embodiment, the distance between the positive electrode terminal IT1P of the DC terminal IT1 and the positive electrode terminal IT2P of the DC terminal IT2 is shorter than the distance between the positive electrode terminal IT1P of the DC terminal IT1 and the negative electrode terminal IT2N of the DC terminal IT2. Similarly, the distance between the negative electrode terminal IT1N of the DC terminal IT1 and the negative electrode terminal IT2N of the DC terminal IT2 is shorter than the distance between the negative electrode terminal IT1N of the DC terminal IT1 and the positive electrode terminal IT2P of the DC terminal IT2.

The DC terminals (IT1, IT2) of the first and second power modules (502, 504) are electrically connected to the terminals of the first and second capacitor modules (302, 304), as will be described later. With the configuration of the embodiment, since the DC terminals (IT1, IT2) are arranged so as to face each other, the connection between the first and second capacitor modules 302 and 304 can be made over a short distance, and therefore the inductance can be reduced.

As described above, the DC terminals (IT1, IT2) of the first and second power modules (502, 504) are set along the sides, which closely face each other, of the first and second power modules (502, 504). The AC terminals (OT1, OT2) of the first and second power modules (502, 504) are arranged along the other sides of the modules (502, 504) in parallel.

In other words, the DC terminals (IT1, IT2) of the power modules 101 are positioned in the vicinity of the center line between the first and second power modules (502, 504) arranged side by side, that is, in the vicinity of the center line of the housing 210. The AC terminals OT of the power module 101 are positioned on the outer sides of the first and second power modules (502, 504) arranged side by side, that is, at the ends of the housing 210.

As a result, the DC terminals (IT1, IT2) of the first and second power modules (502, 504) are positioned between the IGBTs 111 provided for the power modules.

The AC terminals (OT1, OT2) are connected to external connection terminals (OJ1, OJ2) provided for one side of the housing 210 and are connected to the external rotating electric machines 30 and 40. Alternatively, the external connection terminals (OJ1, OJ2) may be provided for, for example, opposite two sides of the housing 210.

Figure 7:
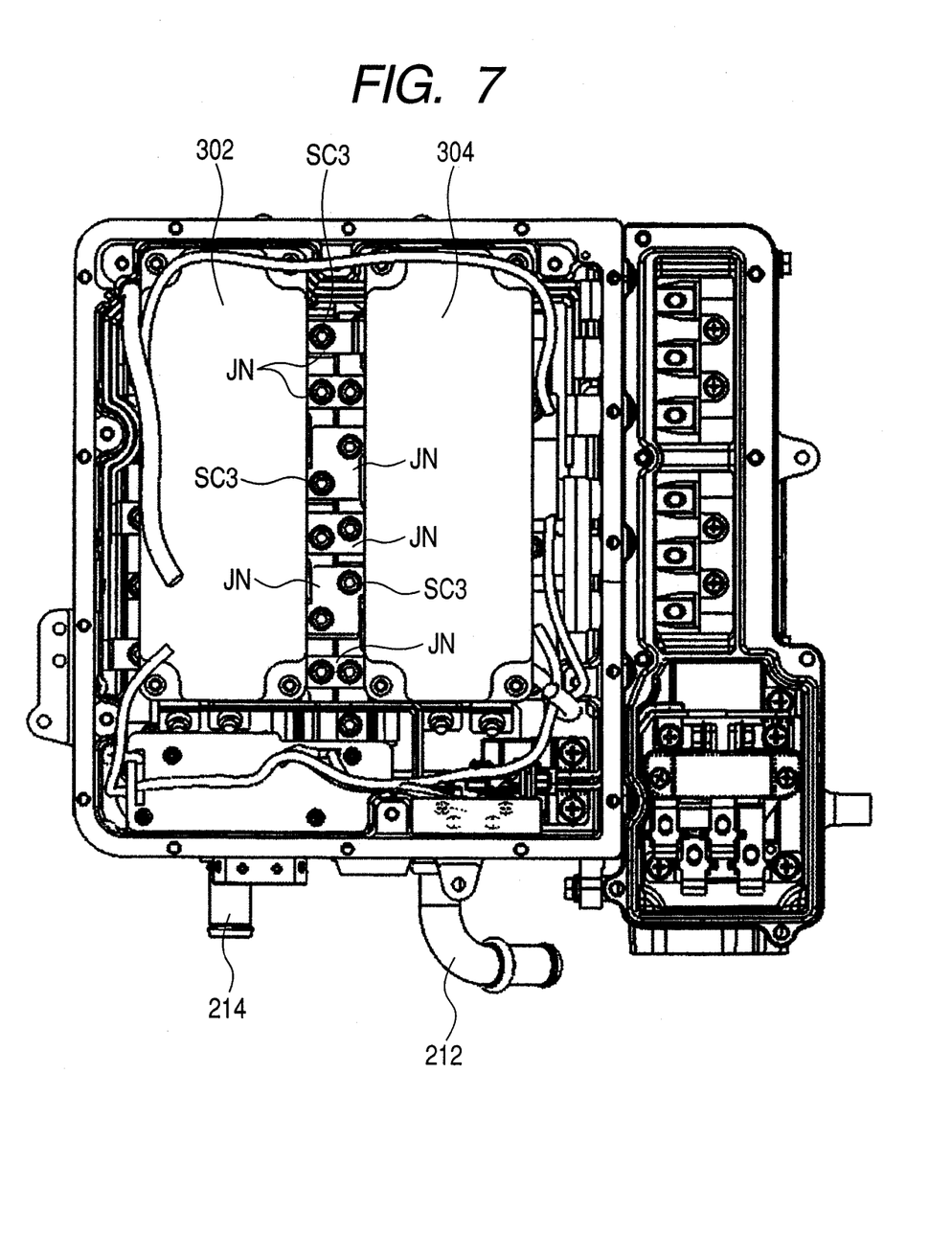
FIG. 7 is a plan view showing arrangement of a capacitor module in the case in the power inverter.

FIG. 7 is a plan view showing a state where the capacitor module 102 is arranged in the housing 210.

The power inverter 200 of the embodiment has two capacitor modules 102 corresponding to the first and second capacitor modules (302, 304). In each of the first and second capacitor modules (302, 304), for example, five or six film capacitors (capacitor cells) are housed in a rectangular-parallelepiped case made of a resin material.

The first and second capacitor modules (302, 304) are arranged side by side above the first and second power modules (502, 504), respectively.

Figure 8A:
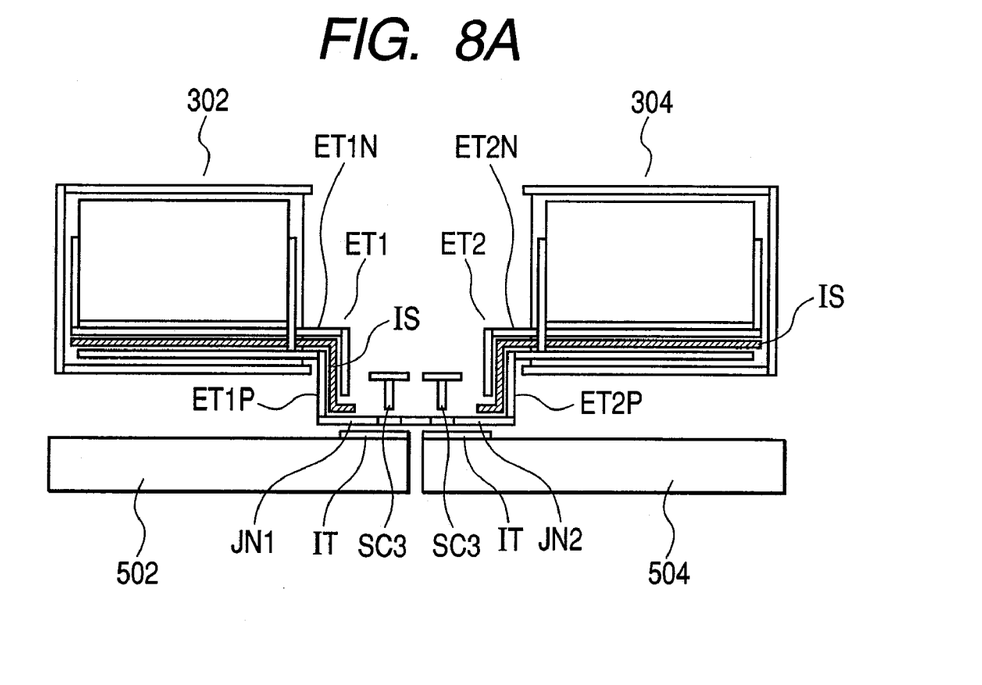
FIGS. 8A and 8B are cross sections showing a connection part of the capacitor module and the power module provided for the power inverter.
Figure 8B:
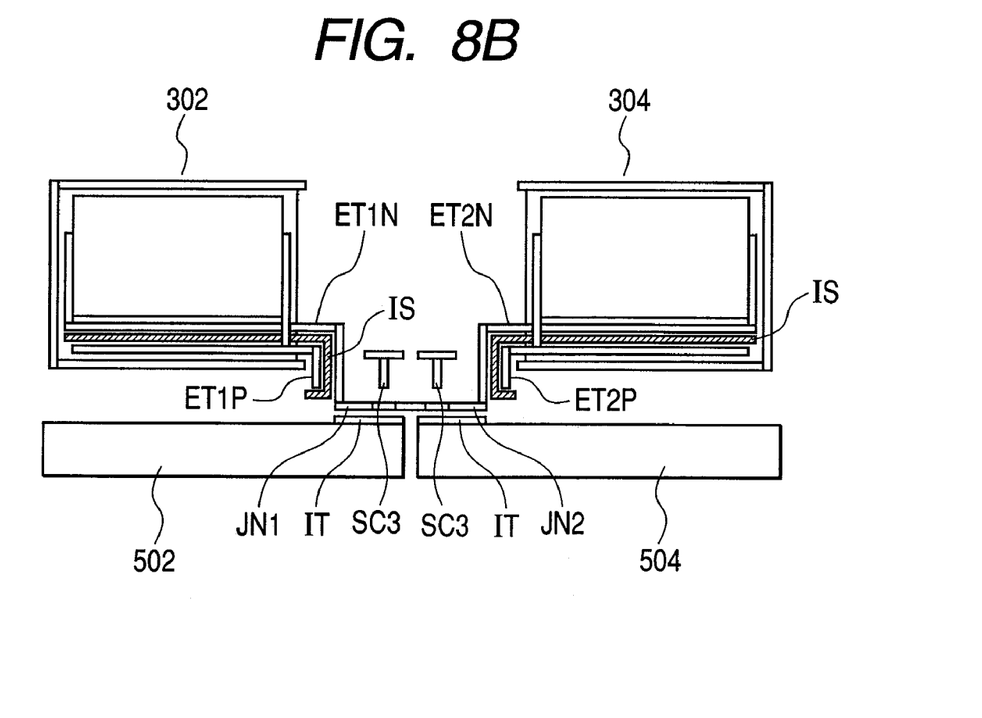

FIGS. 8A and 8B are cross sections each schematically showing the first and second capacitor modules (302, 304). The diagrams show sections in a plane perpendicular to the longitudinal direction of the first and second capacitor modules (302, 304).

As shown in FIGS. 8A and 8B, the first capacitor module 302 has the electrode ET1 for electric connection to the junctions JN1 and JN2. Similarly, the second capacitor module 304 has the electrode ET2 for electric connection to the junctions JN1 and JN2. Each of the electrodes (ET1, ET2) comprises a laminate structure of a positive electrode terminal ET1P (or ET2P) made of a metal plate, a negative electrode terminal ET1N (or ET2N) made of a metal plate, and an insulating sheet (layer) IS sandwiched between those electrode terminals ET1P and ET1N (or ET2P and ET2N). Although the metal plates are preferably made of copper or copper alloy, the invention is not limited to the configuration.

FIG. 8A shows the connection part between the positive electrodes of the capacitor module and the power module, and FIG. 8B shows the connection part between the negative electrodes of them. The sections of FIGS. 8A and 8B show a positional relation in which they are shifted only by the distance of the neighboring DC terminals IT1 and IT2 in the longitudinal direction of the capacitor modules.

The first and second capacitor modules (302, 304) are slightly apart from each other and fixed on the electrodes (ET1, ET2). The electrodes (ET1, ET2) are extended from the bottom sides of the first and second capacitor modules (302, 304) toward the junction (JN1, JN2). The electrodes (ET1, ET2) are connected to the DC terminals (IT1, IT2) of the first and second power modules (502, 504) via the junction (JN1, JN2), respectively.

As shown in FIGS. 8A and 8B, the electrodes (ET1, ET2) may be physically connected to each other in the junction (JN1, JN2) to the first and second DC terminals (IT1, IT2) of the first and second power module 504 originally. Instead of the case of FIGS. 8A and 8B, the electrodes (ET1, ET2) may be provided in a separated state and, at a state where the electrodes (ET1, ET2) are connected to the DC terminals IT of the power module 101, may be physically and electrically connected to each other.

The junction (JN1, JN2) between the electrodes (ET1, ET2) and the DC terminals (IT1, IT2) are fixed to the DC terminals (IT1, IT2) by attaching screws SC3 in the DC terminals IT via the junction (JN1, JN2). Consequently, reliable electric connection is achieved.

The first and second capacitor modules (302, 304) and the first and second power modules (502, 504) shown in FIG. 8 correspond to the first and second capacitor modules (302, 304) and the first and second power modules (502, 504), respectively.

As described above, according to the embodiment, it is possible to provide the power inverter with reduced main circuit inductance. In addition, a smaller power inverter can be provided.

Although the embodiments of the present invention have been described above in detail, the invention is not limited to the foregoing embodiments but can be properly changed within the scope of the technical idea. For example, although the capacitor module is arranged above the power module in the embodiments, a configuration of arranging the capacitor module below the power module, or a configuration of disposing the capacitor module on the side of the power module may also be employed. The foregoing embodiments may be used singly or in combination.

What is claimed is:

1. A power inverter comprising:
   a first power module having a first long side, a second long side opposite the first long side, a first short side, and a second short side opposite the first short side, said first and second short sides being disposed perpendicularly to the first and second long sides;
   a second power module having a third long side, a fourth long side opposite the third long side, a third short side, and a fourth short side opposite the third short side, said third and fourth short sides being disposed perpendicularly to the third and fourth long sides;
   a coolant channel structure, including a first coolant channel and a second coolant channel, for flowing a coolant through, said first and second coolant channels being arranged side by side; wherein,
   the first power module includes a plurality of first semiconductor chips for converting from DC current to AC current or from AC current to DC current, and a first DC terminal arranged along the first long side, for inputting and outputting the DC current;

the second power module includes a plurality of second semiconductor chips for converting from DC current to AC current or from AC current to DC current, and a second DC terminal arranged along the third long side, for inputting and outputting DC current;

the first power module is arranged so that the first and second long sides are disposed along the first coolant channel, and a plane formed by the first long side, second long side, first short side, and second short side is arranged opposite the first coolant channel;

the second power module is arranged so that the third and fourth long sides are disposed along the second coolant channel, and a plane formed by the third long side, fourth long side, third short side, and fourth short side is arranged opposite the second coolant channel; and the first and second power modules are arranged so that the first DC terminal of the first power module is opposite the second DC terminal of the second power module.

2. The power inverter according to claim 1, wherein:
the first power module has a first metal base for supporting the first semiconductor chip on one side of the first metal base;
the second power module has a second metal base for supporting the second semiconductor chip on one side of the second metal base;
the first metal base is fixed to the coolant channel structure opposite the first coolant channel; and
the second metal base is fixed to the coolant channel structure opposite the second coolant channel.

3. The power inverter according to claim 1, further comprising a metal housing, wherein:
a smoothing capacitor, the first power module and second power module are housed in the metal housing; and
one side wall of the metal housing has an inlet pipe and outlet pipe which are connected to the first coolant channel and second coolant channel, respectively.

4. The power inverter according to claim 1, wherein:
the first power module has a first metal base, and the second power module has a second metal base;
the first coolant channel had a first mouth which is closed off by first metal base, thereby to ensure the first coolant channel;
the second coolant channel has a second mouth which is closed off by the second metal base, thereby to ensure the first coolant channel;
the first semiconductor chip is mounted on the first metal base; and
the second semiconductor chip is mounted on the second metal base.

5. The power inverter according to claim 1, wherein:
the first and second DC terminals comprise a plate-shaped positive electrode terminal and a plate-shaped negative electrode terminal, respectively; and
each of the two electrode terminals has a laminated structure of two metal plates, with an insulating layer sandwiched therebetween.

6. The power inverter according to claim 1, wherein:
each of the first and second power modules has plural upper arms and lower arms which are comprised of the plural first semiconductor chips and second semiconductor chips arranged along a coolant channel direction;

the first power module has a plate-shaped positive electrode terminal and a plate-shaped negative electrode terminal arranged beside the first long side; and
the second power module has a plate-shaped positive electrode terminal and a plate-shaped negative electrode terminal arranged beside the third long side;
each of the first and second power modules has a laminated conductor structure comprising a plate-shaped positive electrode conductor, a plate-shaped negative electrode conductor and an insulating layer sandwiched between the two plate-shaped conductors, with the plate-shaped positive electrode conductor connected to the plate-shaped positive electrode terminal, and the plate-shaped negative electrode conductor connected to the plate-shaped negative electrode terminal; and
the laminated conductor structure is connected to the plural upper arms and lower arms via another conductor.

7. The power inverter according to claim 1, wherein:
the first DC terminal includes a first positive electrode terminal and a first negative electrode terminal; and
the second DC terminal includes a second positive electrode terminal and a second negative electrode terminal;
each of the first positive electrode terminal, first negative electrode terminal, second negative electrode terminal, and second negative electrode terminal comprises plural terminals; and
the plural first positive electrode terminals and first negative electrode terminals are respectively arranged alternately along the first long side; and
the plural second positive electrode terminals and second negative electrode terminals are respectively arranged alternately along the third long side.

8. The power inverter according to claim 1, further comprising:
a capacitor module electrically connected to the first power module to smooth the DC current supplied to the first power module; wherein,
the first power module is arranged between the capacitor module and the coolant channel structure; and
the capacitor module is arranged opposite the first power module and separated from it by a gap.

9. The power inverter according to claim 8, wherein:
the capacitor module has a connecting conductor plate for connecting to the first power module; and
the connecting conductor plate is formed by a laminated structure comprising a positive electrode conductor plate, a negative electrode conductor plate, and an insulating layer sandwiched between the two conductor plates, the connecting conductor plate being extended from inside of the capacitor module;
one end of the connecting conductor plate is bent at the first power module side; and
a face of the bent end is connected to the DC terminal.

10. The power inverter according to claim 8, wherein:
the capacitor module comprises a first capacitor module and a second capacitor module; and
the first capacitor module is arranged opposite the first power module and separated from it by a gap; and
the second capacitor module is arranged opposite the second power module and separated from it by a gap.

* * * * *